(12) United States Patent
An (10) Patent No.: US 8,456,913 B2
(45) Date of Patent: *Jun. 4, 2013

(54) SEMICONDUCTOR MEMORY APPARATUS AND METHOD FOR CONTROLLING PROGRAMMING CURRENT PULSE

(75) Inventor: Yong Bok An, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 240 days.

This patent is subject to a terminal disclaimer.

(21) Appl. No.: 12/983,050

(22) Filed: Dec. 31, 2010

(65) Prior Publication Data

US 2012/0057417 A1    Mar. 8, 2012

(30) Foreign Application Priority Data

Sep. 3, 2010   (KR) .................. 10-2010-0086397

(51) Int. Cl.
*G11C 7/00* (2006.01)

(52) U.S. Cl.
USPC .................. 365/185.16; 365/148; 365/230.06

(58) Field of Classification Search
USPC .................. 365/148, 158, 163, 171, 189.16, 365/230.06, 201
See application file for complete search history.

(56) References Cited

U.S. PATENT DOCUMENTS

| | | | |
|---|---|---|---|
| 6,307,868 B1* | 10/2001 | Rakib et al. .................. 370/485 |
| 6,496,418 B2* | 12/2002 | Kawahara et al. ........ 365/185.24 |
| 7,095,707 B2* | 8/2006 | Rakib et al. .................. 370/204 |
| 7,593,255 B2 | 9/2009 | Happ et al. |
| 7,633,802 B2* | 12/2009 | Mokhlesi ................ 365/185.18 |
| 7,706,189 B2* | 4/2010 | Dong et al. ............. 365/185.19 |
| 7,848,165 B2* | 12/2010 | Choi et al. .................... 365/201 |
| 7,937,630 B2* | 5/2011 | Mori ............................. 714/718 |
| 2008/0068903 A1 | 3/2008 | Park et al. |
| 2009/0175072 A1 | 7/2009 | Choi et al. |
| 2011/0261611 A1* | 10/2011 | An ................................ 365/163 |
| 2011/0261612 A1* | 10/2011 | An ................................ 365/163 |
| 2012/0081953 A1* | 4/2012 | An ................................ 365/163 |

FOREIGN PATENT DOCUMENTS

| | | |
|---|---|---|
| JP | 2004-362761 | 12/2004 |
| KR | 1020070032427 A | 3/2007 |
| KR | 1020090097726 A | 9/2009 |
| KR | 1020100067841 A | 6/2010 |
| KR | 1020100090076 A | 8/2010 |

\* cited by examiner

*Primary Examiner* — Gene Auduong (74) *Attorney, Agent, or Firm* — William Park & Associates Patent Ltd.

(57) ABSTRACT

A semiconductor memory apparatus includes a write control code generation unit configured to generate a write control code which is updated at each pulsing timing of an external test pulse signal applied through a pad; and a data write unit configured to output a programming current pulse which has a magnitude corresponding to the code value of the write control code.

18 Claims, 7 Drawing Sheets

SEMICONDUCTOR MEMORY APPARATUS AND METHOD FOR CONTROLLING PROGRAMMING CURRENT PULSE

CROSS-REFERENCES TO RELATED APPLICATION

The present application claims priority under 35 U.S.C. §119(a) to Korean application number 10-2010-0086397, filed on Sep. 3, 2010, in the Korean Intellectual Property Office, which is incorporated herein by reference in its entirety.

BACKGROUND

1. Technical Field

The present invention relates to a semiconductor memory apparatus, and more particularly, to a technology for controlling a programming current pulse.

2. Related Art

A phase change random access memory (PCRAM) is a non-volatile memory apparatus which programs a memory cell through a programming current pulse.

A PCRAM has a characteristic of a non-volatile memory and may achieve a random access. Also, the PCRAM may be highly integrated at a low cost. The PCRAM stores data by using a phase change material. Specifically, the PCRAM stores data by using a phase change of a phase change material according to a temperature condition, that is, a change in a resistance value according to a phase change.

A phase change material can change to an amorphous state or a crystalline state according to a temperature condition. A representative phase change material is a chalcogenide alloy. A representative chalcogenide alloy is $Ge_2Sb_2Te_5$ composed of germanium (Ge), antimony (Sb), and tellurium (Te). Hence, a phase change material is generally called a "GST".

A PCRAM causes a reversible phase change of a phase change material (GST) between a crystalline state and an amorphous state by using Joule heating generated when a current is applied to the phase change material (GST) under certain conditions. In a known art, the crystalline state is referred to as a "set state". In the set state, the phase change material (GST) has electrical properties substantially equal to those of a metal having a small resistance value. In circuit terms, the amorphous state is referred to as a reset state. In the reset state, the phase change material (GST) has a larger resistance value than that in the set state. That is to say, the PCRAM stores data through a change in a resistance value between the crystalline state and the amorphous state, and determines a level of the stored data by sensing a current flowing through the phase change material (GST) or a voltage change depending on a current change. In the known art, the set state is defined as a logic level of '0', and the reset state is defined as a logic level of '1'. A state of the phase change material (GST) may be continuously maintained even though power is interrupted.

Meanwhile, the amorphous state and the crystalline state of the phase change material (GST) may be mutually changed by a programming current pulse. A set programming current pulse is a programming current which changes the phase change material (GST) of a memory cell to the set state, and a reset programming current pulse is a programming current which changes the phase change material (GST) of the memory cell to the reset state.

As the phase change material (GST) is rapidly cooled after being heated to, for example, a temperature higher than a melting temperature for a certain time by the supply of the reset programming current pulse, the phase change material (GST) is changed to the amorphous state. Also, as the phase change material (GST) is slowly cooled after being heated to, for example, a temperature higher than a crystallization temperature and lower than the melting temperature for a certain time by the supply of the set programming current pulse, the phase change material (GST) is changed to the crystalline state. Meanwhile, because a resistance value can vary depending upon a ratio of an amorphous volume to a crystalline volume of the phase change material (GST), a memory cell can be configured in a multi-level form. In the known art, a large current is flowed as the reset programming current pulse for a time shorter than the set programming current pulse, and a small current is flowed as the set programming current pulse for a time longer than the reset programming current pulse. That is to say, the state of the phase change material (GST) is changed by Joule heating under a certain condition, which is generated due to the supply of the programming current pulse.

Figure 1:
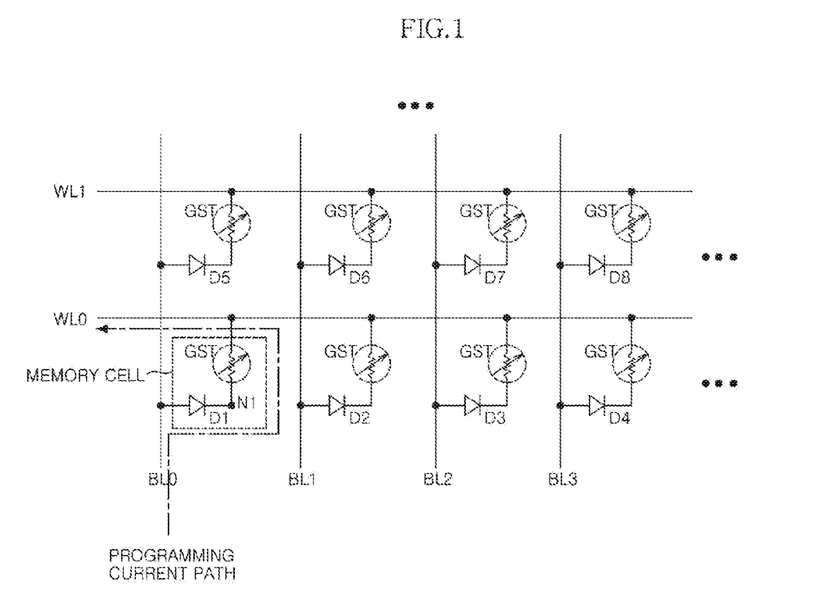
FIG. 1 is a diagram illustrating a memory cell of a known PCRAM.

FIG. 1 is a diagram illustrating a memory cell of a known PCRAM.

Referring to FIG. 1, a memory cell includes a cell diode D1 and a phase change element GST.

An example of the basic operations of the PCRAM configured as mentioned above will be described below.

First, an operation for programming data to the phase change element GST is performed as follows.

When a word line WL is activated to a low level, i.e., a ground voltage, and a certain voltage for a program operation begins to be applied through a bit line BL, since a cell diode D1 becomes a forward biased state, the cell diode D1 is turned on from when a voltage difference between the anode and the cathode of the cell diode D1 is higher than a threshold voltage. As a result, a current path for the program operation is formed among the bit line BL, the phase change element GST, and the word line WL. Therefore, by supplying a programming current pulse corresponding to data to be programmed to the phase change element GST through the bit line BL, the phase change element GST can be changed to the crystalline state or the amorphous state. Here, if the data to be programmed has a logic level of '1', the phase change element GST may be changed to a reset state by supplying a reset programming current pulse, and if the data to be programmed has a logic level of '0', the phase change element GST may be changed to a set state by supplying a set programming current pulse. As mentioned above, the reset state as the amorphous state has a larger resistance value than the set state as the crystalline state.

Also, an operation for detecting the data programmed to the phase change element GST is performed as follows.

When the word line WL is activated to the low level, e.g., the ground voltage, and a certain voltage for a read or a verification operation ("a read operation") begins to be applied through the bit line BL, since the cell diode D1 becomes the forward biased state, the cell diode D1 is turned on from when the voltage difference between the anode and the cathode of the cell diode D1 is higher than the threshold voltage. As a result, the current path for the read operation is formed among the bit line BL, the phase change element GST, and the word line WL. Therefore, when a certain voltage or a certain current for the read operation is applied to the phase change element GST through the bit line BL, an amount of current flowing through the phase change element GST or the magnitude of a voltage drop in the phase change element GST varies depending upon the resistance value of the phase change element GST. Therefore, data stored in the phase change element GST is discriminated.

Figure 2:
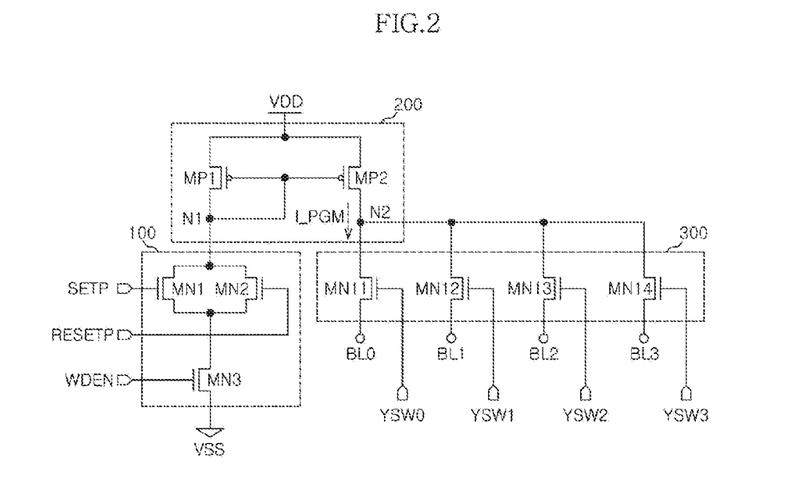
FIG. 2 is a configuration diagram of a data write unit of the known PCRAM.

FIG. 2 is a configuration diagram of a data write unit of a known PCRAM.

Referring to FIG. 2, a data write unit includes a current control section 10, a current driving section 20, and a selection section 30.

The current control section 10 is configured to control a voltage level of a control node N1 in response to a set control signal SETP and a reset control signal RESETP when a write enable signal WDEN is activated. Current driving forces of an NMOS transistor MN1 controlled by the set control signal SETP and an NMOS transistor MN2 controlled by the reset control signal RESETP may be designed to be different from each other. The set control signal SETP and the reset control signal RESETP may be inputted in a pulse type.

The current driving section 20 is configured to drive a programming current pulse I_PGM with a magnitude corresponding to the voltage level of the node N1, to an output terminal N2. The programming current pulse I_PGM can be classified into a set programming current pulse corresponding to the set control signal SETP and a reset programming current pulse corresponding to the reset control signal RESETP.

The selection section 30 is configured to output the programming current pulse I_PGM, driven from the current driving section 20 to bit lines BL0 through BL3 which respectively correspond to a plurality of select signals YSW<0:3>.

Figure 3:
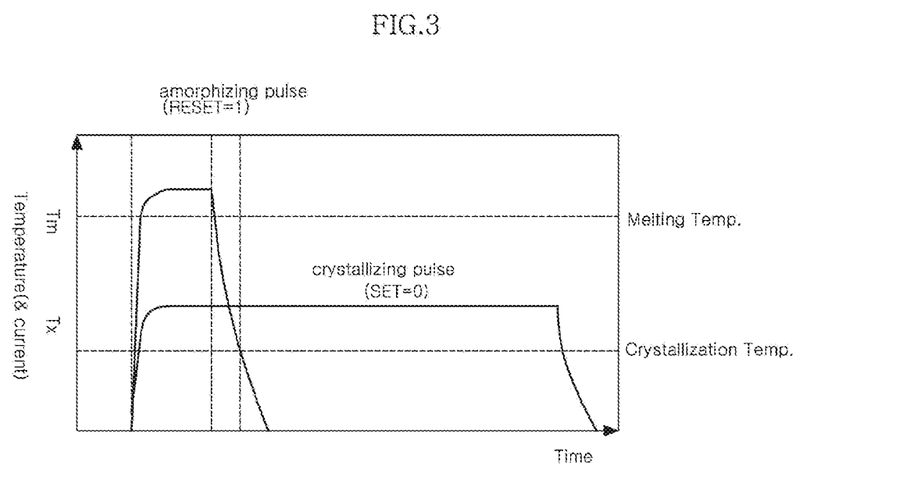
FIG. 3 is a graph showing programming current pulses which are outputted from the data write unit of FIG. 2.

FIG. 3 is a graph showing programming current pulses which are outputted from the data write unit of FIG. 2.

Referring to FIG. 3, it is to be appreciated that a reset programming current pulse is driven for a short time to be higher than a melting temperature and a set programming current pulse is driven for a long time when compared to the reset programming current pulse, to be lower than the melting temperature. For reference, in the drawing, the reset programming current pulse is shown as an amorphizing pulse, and the set programming pulse is shown as a crystallizing pulse.

Meanwhile, in order to shorten a programming time, a technology of stepwise reducing a magnitude of a set programming current pulse may be employed. Here, programming characteristics may be controlled by controlling a slope at which the set programming current pulse decreases and a magnitude of current which decreases in each step. In the known art, limitations may exist in controlling the set programming current pulse, and improvement of the degree of integration may be difficult since a resistor, a delay element, etc. are used to control the set programming current pulse.

SUMMARY

In an exemplary embodiment of the present invention, a semiconductor memory apparatus includes a write control code generation unit configured to generate a write control code which is updated at each pulsing timing of an external test pulse signal applied through a pad, and a data write unit configured to output a programming current pulse which has a magnitude corresponding to the code values of the write control code.

In another exemplary embodiment of the present invention, a semiconductor memory apparatus includes a write control code generation unit configured to generate a write control code which is updated at each pulsing timing of a control pulse signal which is controlled in a pulsing cycle thereof according to a control code which is stored in the semiconductor memory apparatus, and a data write unit configured to output a programming current pulse which has a magnitude corresponding to the code value of the write control code.

In yet another exemplary embodiment of the present invention, a method for controlling a programming current pulse in a semiconductor memory apparatus to control a programmed state of a memory cell depending upon a magnitude of the programming current pulse includes the steps of generating a control pulse signal which is controlled in a pulsing cycle thereof in conformity with a change in code values of control codes, generating write control code which is updated in code values thereof at each pulsing timing of the control pulse signal; and outputting a programming current pulse which has a magnitude corresponding to the code value of the write control code.

BRIEF DESCRIPTION OF THE DRAWINGS

Features, aspects, and embodiments are described in conjunction with the attached drawings, in which.

DETAILED DESCRIPTION

Hereinafter, a semiconductor memory apparatus and a method for controlling a programming current pulse according to the present invention will be described below with reference to the accompanying drawings through exemplary embodiments.

For reference, since terms, symbols and signs that are used in drawings and in this detailed description to designate devices, blocks, and so on may be used for detailed units as the occasion demands, it is to be noted that the same terms, symbols and signs may not designate the same devices, blocks, and so on in an entire circuitry. In general, the logic signals of a circuit and binary data values are divided into a high level (H) and a low level (L) in correspondence to voltage levels and may be represented as '1' and '0'. Furthermore, as the occasion demands, a high impedance state (a high-Z state) may be defined and described.

Figure 4A:
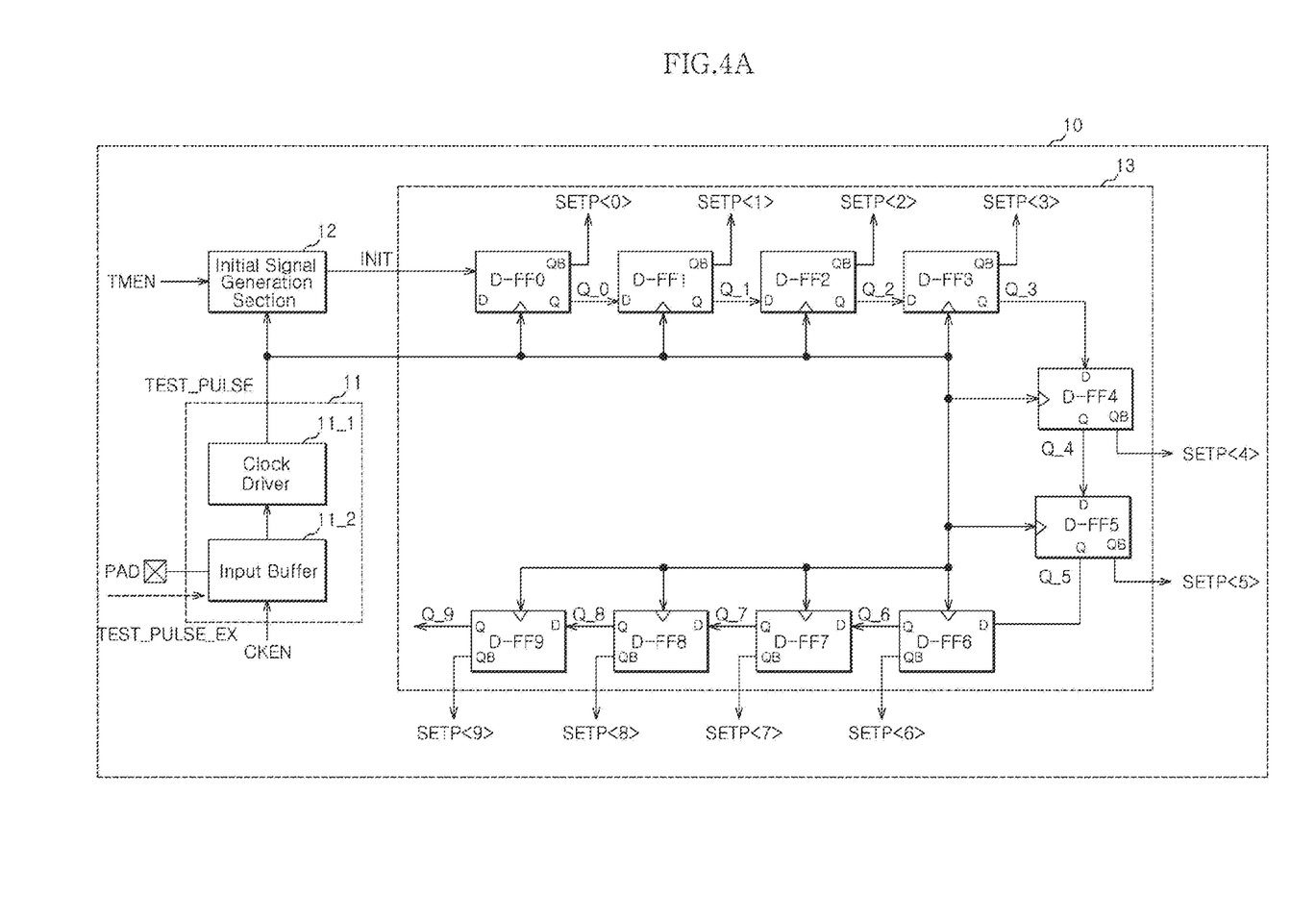
FIG. 4a is a configuration diagram of a write control code generation unit of a semiconductor memory apparatus in accordance with an exemplary embodiment of the present invention.
Figure 4B:
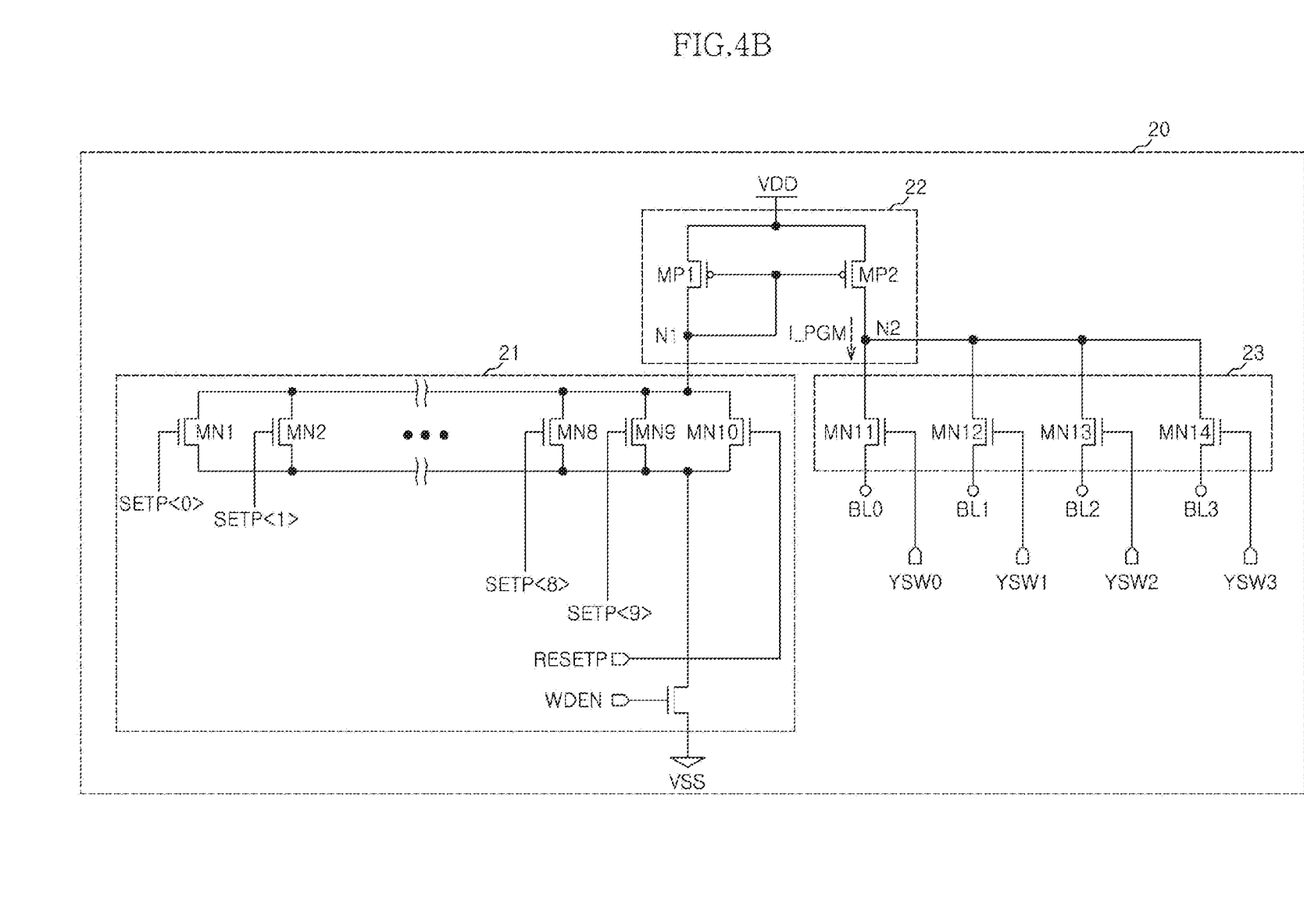
FIG. 4b is a configuration diagram of a data write unit of the semiconductor memory apparatus in accordance with the exemplary embodiment of the present invention.

FIG. 4a is a configuration diagram of a write control code generation unit of a semiconductor memory apparatus in accordance with an exemplary embodiment of the present invention, and FIG. 4b is a configuration diagram of a data write unit of the semiconductor memory apparatus in accordance with the exemplary embodiment of the present invention.

The semiconductor memory apparatus in accordance with the present exemplary embodiment of the invention includes only a simplified configuration for the sake of clear description of the spirit of the invention.

Referring to FIGS. 4a and 4b, a semiconductor memory apparatus includes a write control code generation unit 10 and a data write unit 20.

The detailed configuration and operations of the semiconductor memory apparatus configured as mentioned above will be described below.

The write control code generation unit 10 is configured to generate a write control code SETP<0:N> which are updated in code values thereof at each pulsing timing of an external test pulse signal TEST_PULSE_EX which is applied through a pad PAD. In the present exemplary embodiment, the write control code SETP<0:N> is composed of 10-bit code.

In the present exemplary embodiment, the write control code generation unit 10 includes a signal input section 11, an initial signal generation section 12, and a plurality of latch sections 13.

The signal input section 11 is configured to buffer the external test pulse signal TEST_PULSE_EX and output a test pulse signal TEST_PULSE. The signal input section 11 includes a clock driver 11_1 and an input buffer 11_2.

The initial signal generation section 12 is configured to receive a test enable signal TMEN and output an initial pulse signal INIT, under the control of the test pulse signal TEST_PULSE.

The plurality of latch sections 13 are configured to sequentially transfer the initial pulse signal INIT under the control of the test pulse signal TEST_PULSE. The plurality of latch sections 13 are composed of D flip-flops. The plurality of latch sections 13 output the write control code SETP<0:9> corresponding to signals latched in the plurality of latch sections.

The plurality of latch sections 13 output latched signals as a plurality of first output signals Q_0 through Q_9 under the control of the test pulse signal TEST_PULSE, and output a plurality of second output signals which are acquired by inverting the plurality of first output signals Q_0 through Q_9, as the write control codes SETP<0:N>.

The data write unit 20 is configured to output a programming current pulse I_PGM which has a magnitude corresponding to the code value of the write control code SETP<0:9> or a magnitude corresponding to a reset control signal RESETP. The programming current pulse I_PGM may be classified into a set programming current pulse corresponding to the write control codes SETP<0:N> or a reset programming current pulse corresponding to the reset control signal RESETP. The programming current pulse I_PGM outputted from the data write unit 20 is transferred through bit lines to corresponding memory cells selected among a plurality of memory cells. An update cycle of the write control codes SETP<0:9> is controlled in correspondence to a pulsing period of the external test pulse signal TEST_PULSE_EX. Accordingly, a waveform of the programming current pulse I_PGM may be controlled by controlling the pulsing period of the external test pulse signal TEST_PULSE_EX.

In the present exemplary embodiment, the data write unit 20 includes a current control section 21, a current driving section 22 and a selection section 23.

The current control section 21 is configured to control first current I1 according to the code values of the write control codes SETP<0:N> when a write enable signal WDEN is activated to a high level. The current driving section 22 is configured to drive the programming current pulse I_PGM, which has a magnitude corresponding to the first current I1, to an output terminal N2. The selection section 23 is configured to output the programming current pulse I_PGM, driven from the current driving section 22, to bit lines BL0 through BL4 which respectively correspond to a plurality of select signals YSW0 through YWS3.

Figure 5:
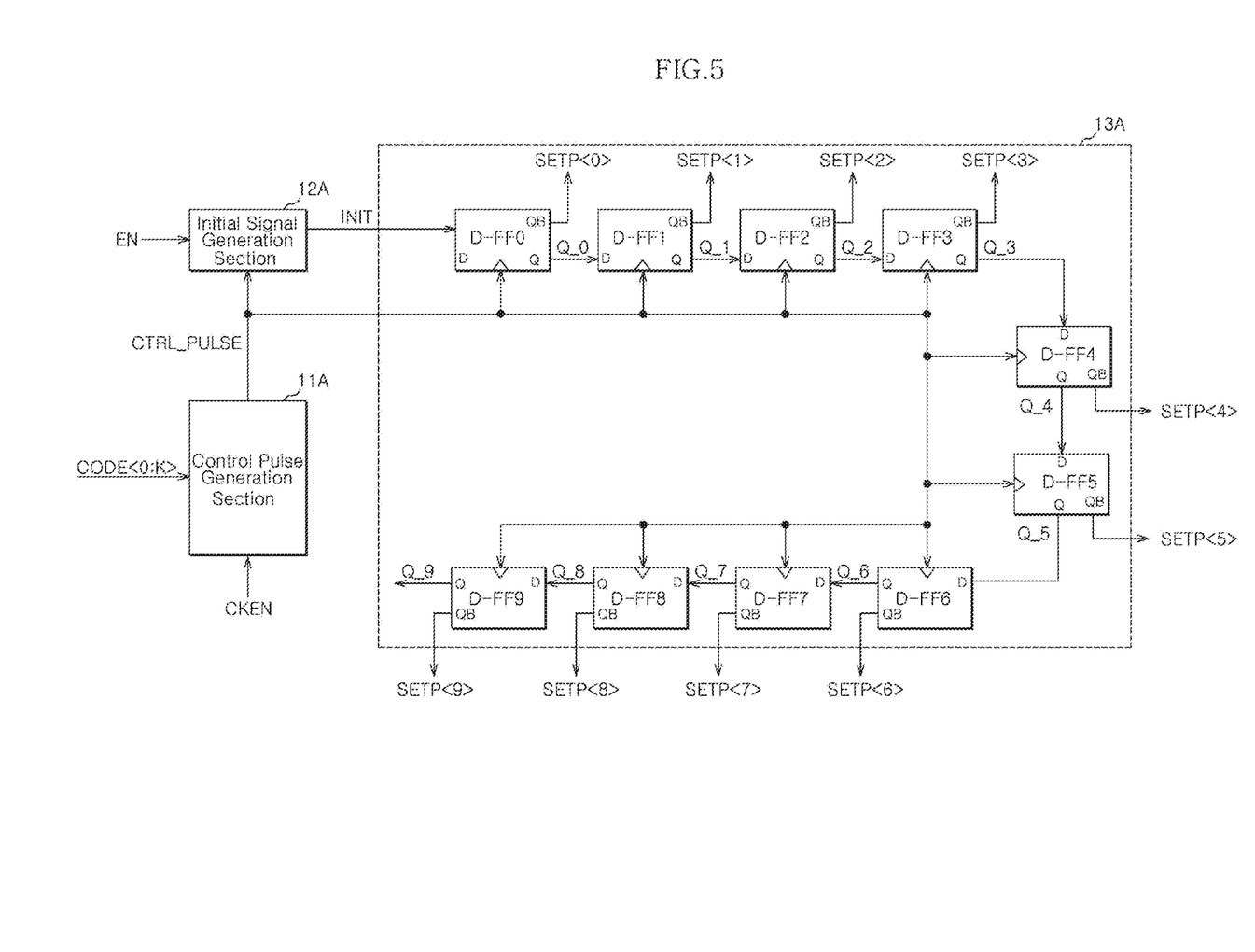
FIG. 5 is a configuration diagram of a write control code generation unit of a semiconductor memory apparatus in accordance with another exemplary embodiment of the present invention.

FIG. 5 is a configuration diagram of a write control code generation unit of a semiconductor memory apparatus in accordance with another exemplary embodiment of the present invention.

The write control code generation unit of the semiconductor memory apparatus in accordance with the present exemplary embodiment of the invention includes only a simplified configuration for the sake of clear description of the technical spirit to be suggested.

Referring to FIG. 5, a write control code generation unit is configured to generate a write control code SETP<0:N> which is updated in code value thereof at each pulsing timing of a control pulse signal CTRL_PULSE which is controlled in a pulsing cycle thereof according to the code value of a control code CODE<0:K>. In the present exemplary embodiment, the write control code SETP<0:N> is composed of 10-bit code.

In the present exemplary embodiment, the write control code generation unit includes a control pulse generation section 11A, an initial signal generation section 12A, and a plurality of latch sections 13A.

The control pulse generation section 11A is configured to generate the control pulse signal CTRL_PULSE which is controlled in the pulsing cycle thereof according to a change in the code values of the control codes CODE<0:K> when a clock enable signal CKEN is activated. For reference, the control codes CODE<0:K> may be defined as a code which is established in a mode register set (MRS). Also, the control code CODE<0:K> may be defined as signals which are outputted from an internal control logic or a command decoder.

The initial signal generation section 12A is configured to output an enable signal EN as an initial pulse signal INIT under the control of the control pulse signal CTRL_PULSE.

The plurality of latch sections 13A are configured to sequentially transfer the initial pulse signal INIT under the control of the control pulse signal CTRL_PULSE. The plurality of latch sections 13A are composed of D flip-flops. The plurality of latch sections 13A output signals latched thereby as the write control code SETP<0:9>.

The plurality of latch sections 13A output latched signals as a plurality of first output signals Q_0 through Q_9 under the control of the control pulse signal CTRL_PULSE, and output a plurality of second output signals which are acquired by inverting the plurality of first output signals Q_0 through Q_9, as the write control codes SETP<0:9>. Accordingly, a waveform of a programming current pulse may be controlled by controlling the control codes CODE<0:K> which are established in the mode register set (MRS), and the like.

Figure 6:
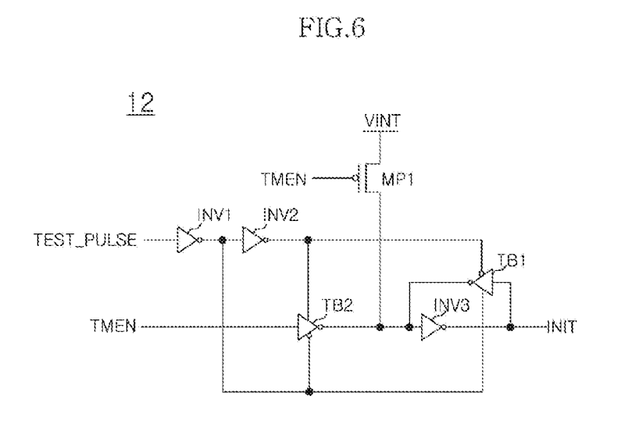
FIG. 6 is a configuration diagram of an exemplary embodiment of an initial signal generation section.

FIG. 6 is a configuration diagram of an exemplary embodiment of an initial signal generation section.

Referring to FIG. 6, the initial signal generation section 12 is composed of a D latch which latches the test enable signal TMEN under the control of the test pulse signal TEST_PULSE. The initial signal generation section 12 outputs the initial pulse signal INIT of a low level while the test enable signal TMEN maintains a low level, and latches the test enable signal TMEN, which is inputted under the control of the test pulse signal TEST_PULSE, while the test enable signal TMEN maintains a high level. For reference, the initial signal generation section 12A shown in FIG. 5 may be configured in the same way as described above.

Figure 7:
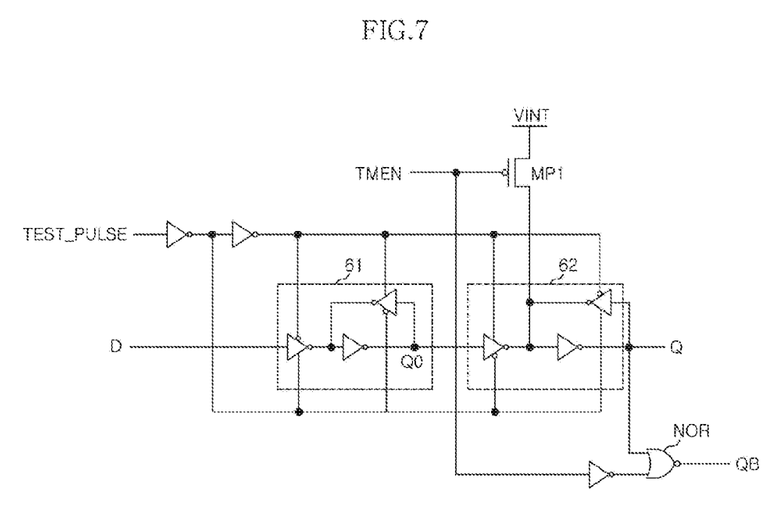
FIG. 7 is a configuration diagram of an exemplary embodiment of a latch section.

FIG. 7 is a configuration diagram of an exemplary embodiment of a latch section.

FIG. 7 representatively illustrates one of the plurality of latch sections 13.

Referring to FIG. 7, each of the plurality of latch sections 13 includes a first latch stage 61 and a second latch stage 62.

The first latch stage 61 is configured to latch an input signal D during a period for which the test pulse signal TEST_PULSE is activated to a high level. The second latch stage 62 is configured to latch a signal outputted from the first latch stage 61 during a period for which the test pulse signal TEST_PULSE is deactivated to a low level.

In the case where the test enable signal TMEN maintains the low level, both a first output signal Q and a second output signal QB, which are outputted from the latch section 13, have low levels. Also, in the case where the test enable signal TMEN is activated to the high level, a level of the first output signal Q is determined by the latched input signal D, and a level of the second output signal QB has a complementary relationship with respect to the first output signal Q. The first output signal Q is used as an input signal to another latch section 13, and the second output signal QB constitutes the write control code SETP<0:9>. For reference, each of the plurality of latch sections 13A shown in FIG. 5 may be configured in the same way as stated above.

Figure 8:
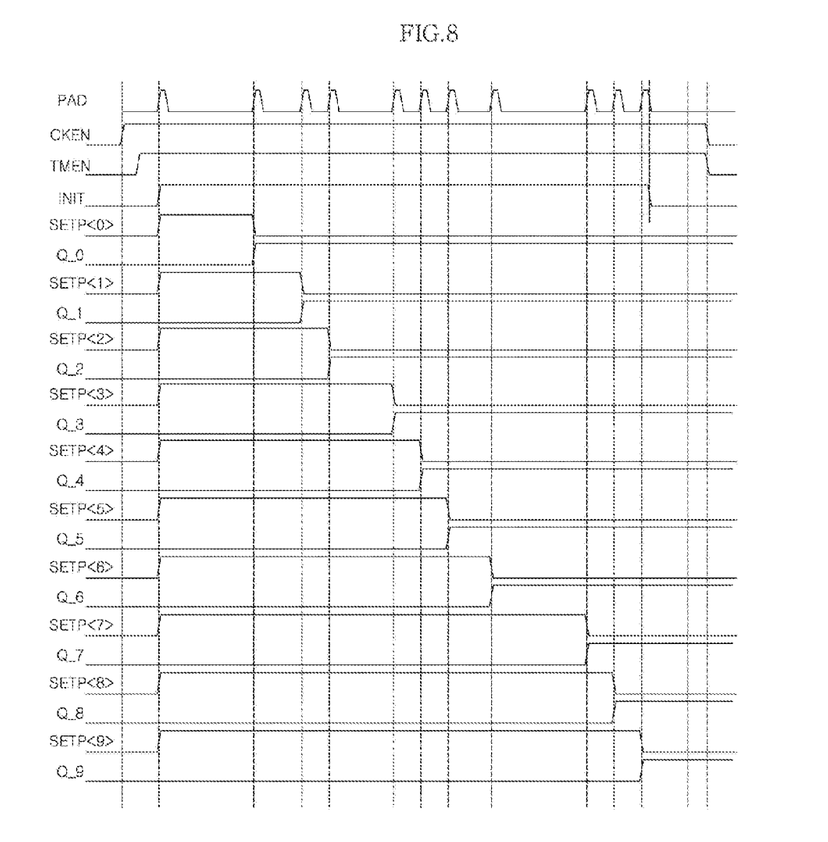
FIG. 8 is a timing diagram illustrating internal operations of the write control code generation unit in accordance with the exemplary embodiment of the present invention.

FIG. 8 is a timing diagram illustrating internal operations of the write control code generation unit in accordance with the exemplary embodiment of the present invention.

Internal operations of the write control code generation unit 10 configured as mentioned above will be described below with reference to the timing diagram of FIG. 8 along with FIG. 4a.

First, when both the clock enable signal CKEN and the test enable signal TMEN are activated to high levels and the external test pulse signal TEST_PULSE_EX applied through the pad PAD pulses to a high level, the initial pulse signal INIT of a high level is transferred to the plurality of latch sections 13A, and all initial code values of the write control code SETP<0:9> outputted from the plurality of latch sections 13A are outputted to high levels.

Next, assuming that both the clock enable signal CKEN and the test enable signal TMEN maintain high levels, when the external test pulse signal TEST_PULSE_EX pulses a second time, the least significant bit SETP<0> of the write control code SETP<0:9> is converted to a low level, and the write control code SETP<0:9> is updated.

Next, when the external test pulse signal TEST_PULSE_EX pulses a third time, the corresponding bit SETP<1> of the write control code SETP<0:9> is converted to a low level, and the write control code SETP<0:9> is updated.

That is to say, in the semiconductor memory apparatus in accordance with the exemplary embodiments of the present invention, each time the external test pulse signal TEST_PULSE_EX pulses, the write control code SETP<0:9> is updated. Accordingly, in the event that a pulsing timing of the external test pulse signal TEST_PULSE_EX is controlled, since an update cycle of the write control code SETP<0:9> is changed, the waveform of the programming current pulse I_PGM is controlled resultantly. In the semiconductor memory apparatus in accordance with the exemplary embodiments of the present invention, programming characteristics of a memory cell can be controlled by controlling an slope at which the set programming current pulse decreases and a magnitude of current which decreases in each step.

As is apparent from the above descriptions, in the semiconductor memory apparatus in accordance with an exemplary embodiment of the present invention, a waveform of a programming current pulse may be controlled by controlling a pulsing timing of an external test pulse signal in a test mode. Also, in the semiconductor memory apparatus in accordance with another exemplary embodiment of the present invention, a waveform of a programming current pulse may be controlled by controlling code values of control codes.

Further, a method for controlling a programming current pulse in a semiconductor memory apparatus to control a programming state of a memory cell depending upon a magnitude of a programming current pulse includes the steps of generating a control pulse signal which is controlled in a pulsing cycle thereof in conformity with a change in code values of control codes, generating a write control code which is updated in code values thereof at each pulsing timing of the control pulse signal, and outputting a programming current pulse which has a magnitude corresponding to the code value of the write control code. The step of generating the write control codes includes the steps of generating an initial pulse signal under the control of the control pulse signal, and sequentially latching the initial pulse signal under the control of the control pulse signal and outputting the write control code based on a plurality of latched signals.

So far, embodiments of the present invention have been described in detail. For reference, embodiments including additional component elements, which are not directly associated with the technical spirit of the present invention, may be exemplified in order to describe the present invention in further detail. Moreover, an active high configuration or an active low configuration for indicating the activated states of signals and circuits may vary depending upon an embodiment. Furthermore, the configurations of transistors may be changed as the occasion demands in order to realize the same function. Since these embodiment changes have a large number of cases and can be easily inferred by those skilled in the art, the enumeration thereof will be omitted herein.

While certain embodiments have been described above, it will be understood to those skilled in the art that the embodiments described are by way of example only. Accordingly, the semiconductor memory apparatus and the method for controlling a programming current pulse described herein should not be limited based on the described embodiments. Rather, the semiconductor memory apparatus and the method for controlling a programming current pulse described herein should only be limited in light of the claims that follow when taken in conjunction with the above description and accompanying drawings.

What is claimed is:

1. A semiconductor memory apparatus comprising:
   a write control code generation unit configured to generate a write control code which is updated at each pulsing timing of an external test pulse signal applied through a pad; and
   a data write unit configured to output a programming current pulse which has a magnitude corresponding to the code value of the write control code.

2. The semiconductor memory apparatus according to claim 1, wherein an update cycle of the write control code is controlled in correspondence to a pulsing period of the external test pulse signal.

3. The semiconductor memory apparatus according to claim 1,
   wherein the write control code generation unit comprises:
   an initial signal generation section configured to receive a test enable signal and output an initial pulse signal under the control of a test pulse signal; and
   a plurality of latch sections configured to sequentially transfer the initial pulse signal under the control of the test pulse signal, wherein the plurality of latch sections output the write control code corresponding to signals latched in the plurality of latch sections.

4. The semiconductor memory apparatus according to claim 3, wherein the write control code generation unit further comprises:
a signal input section configured to buffer the external test pulse signal and output the test pulse signal to the initial signal generation section and the plurality of latch sections.

5. The semiconductor memory apparatus according to claim 3, wherein the write control code is acquired by inverting the latched signals.

6. The semiconductor memory apparatus according to claim 3, wherein the initial signal generation section comprises a D latch which latches the initial pulse signal under the control of the test pulse signal.

7. The semiconductor memory apparatus according to claim 3, wherein each of the plurality of latch sections comprises:
a first latch stage configured to latch an input signal during an activation period of the test pulse signal; and
a second latch stage configured to latch a signal outputted from the first latch stage during a deactivation period of the test pulse signal.

8. The semiconductor memory apparatus according to claim 1, wherein the data write unit comprises:
a current control section configured to control a current according to a code combination of the write control code; and
a current driving section configured to drive the programming current pulse which has a magnitude corresponding to the current.

9. The semiconductor memory apparatus according to claim 8, wherein the data write unit further comprises:
a selection section configured to output the programming current pulse driven from the current driving section to bit lines which correspond to a plurality of select signals.

10. A semiconductor memory apparatus comprising:
a write control code generation unit configured to generate a write control code which is updated at each pulsing timing of a control pulse signal which is controlled in a pulsing cycle thereof according to a control code which is stored in the semiconductor memory apparatus; and
a data write unit configured to output a programming current pulse which has a magnitude corresponding to the code value of the write control code.

11. The semiconductor memory apparatus according to claim 10, wherein the write control code generation unit comprises:
a control pulse generation section configured to generate the control pulse signal which is controlled in the pulsing cycle thereof according to the code value of the control code, in response to a clock enable signal;
an initial signal generation section configured to receive an enable signal and output an initial pulse signal under the control of the control pulse signal; and
a plurality of latch sections configured to sequentially transfer the initial pulse signal under the control of the control pulse signal, wherein the plurality of latch sections output the write control code corresponding to signals latched in the plurality of latch sections.

12. The semiconductor memory apparatus according to claim 11, wherein the write control code is acquired by inverting the latched signals.

13. The semiconductor memory apparatus according to claim 11, wherein the initial signal generation section comprises a D latch which latches the initial pulse signal under the control of the control pulse signal.

14. The semiconductor memory apparatus according to claim 11, wherein each of the plurality of latch sections comprises:
a first latch stage configured to latch an input signal during an activation period of the control pulse signal; and
a second latch stage configured to latch a signal outputted from the first latch stage during a deactivation period of the control pulse signal.

15. The semiconductor memory apparatus according to claim 10, wherein the data write unit comprises:
a current control section configured to control a current according to a code combination of the write control code; and
a current driving section configured to drive the programming current pulse which has a magnitude corresponding to the current.

16. The semiconductor memory apparatus according to claim 15, wherein the data write unit further comprises:
a selection section configured to output the programming current pulse driven from the current driving section to bit lines which correspond to a plurality of select signals.

17. A method for controlling a programming current pulse in a semiconductor memory apparatus to control a programmed state of a memory cell depending upon a magnitude of the programming current pulse, the method comprising the steps of:
generating a control pulse signal which is controlled in a pulsing cycle thereof in conformity with a change in code values of control codes;
generating write control code which is updated in code values thereof at each pulsing timing of the control pulse signal; and
outputting a programming current pulse which has a magnitude corresponding to the code value of the write control code.

18. The method according to claim 17, wherein the step of generating the write control code comprises the steps of:
generating an initial pulse signal under the control of the control pulse signal; and
sequentially latching the initial pulse signal under the control of the control pulse signal and outputting the write control code based on a plurality of latched signals.

* * * * *